United States Patent
Ng

(10) Patent No.: US 7,053,560 B1
(45) Date of Patent: May 30, 2006

(54) BI-DIRECTIONAL LED-BASED LIGHT

(75) Inventor: James K. Ng, Seattle, WA (US)

(73) Assignee: Dr. LED (Holdings), Inc., Tortola (VG)

(*) Notice: Subject to any disclaimer, the term of this patent is extended or adjusted under 35 U.S.C. 154(b) by 210 days.

(21) Appl. No.: 10/714,761

(22) Filed: Nov. 17, 2003

(51) Int. Cl.
*H05B 41/00* (2006.01)

(52) U.S. Cl. .............. 315/185 R; 315/185 S; 362/800

(58) Field of Classification Search ............ 315/185 R, 315/185 S, 200 A, 200 R, 291, 316, 312, 315/324, 224, 307, 247; 362/800, 231, 296
See application file for complete search history.

(56) References Cited

U.S. PATENT DOCUMENTS

| | | | |
|---|---|---|---|
| 4,939,426 A | * | 7/1990 | Menard et al. ......... 315/185 R |
| 5,749,646 A | * | 5/1998 | Brittell ...................... 362/231 |
| 6,069,452 A | * | 5/2000 | Rossner .................. 315/185 R |
| 6,191,541 B1 | * | 2/2001 | Patel et al. ................. 315/307 |
| 6,288,497 B1 | * | 9/2001 | Chang et al. ........... 315/185 R |
| 6,411,045 B1 | * | 6/2002 | Nerone ....................... 315/291 |

* cited by examiner

*Primary Examiner*—Wilson Lee
(74) *Attorney, Agent, or Firm*—Jeffrey Pearce

(57) ABSTRACT

At least one pair of LEDs, preferably of the super-luminescent type, are connected in parallel but with reverse polarity in series with at least one resistor and driven by a voltage source, which may deliver unrectified alternating current. An array of m series-connected LED pairs may be included in n parallel paths. The printed circuit board in which the LED pair(s) is mounted is adapted to fit into after-market fittings originally intended to receive incandescent light bulbs. In some embodiments, contacts are formed in the edges of lateral protrusions in the PCB.

18 Claims, 4 Drawing Sheets

BI-DIRECTIONAL LED-BASED LIGHT

BACKGROUND OF THE INVENTION

1. Field of the Invention

This invention relates to lights that use multiple light-emitting diodes, as well as to fixtures for mounting such lights.

2. Description of the Related Art

Incandescent light bulbs are commonly used for indicator lamps, task lamps, general lighting, decorative lamps, warning lamps, traffic lamps and the like. However, incandescent bulbs, and to a lesser extent even plasma-based fluorescent and halogen lights, are generally inefficient in terms of energy use and are subject to frequent replacement due to their limited lifetime. Significant savings can be made by the use light bulbs where the source of light is light-emitting diodes (LED).

LEDs are much more efficient (in terms of lumens per watt) than incandescent and fluorescent lights; moreover, LEDs generally last much longer. This is particularly true of the class of LEDs known as "super-luminescent" or "super-bright," which have already found uses in such applications as automobile tail lights and traffic signal lights.

Being diodes, one problem with LEDs is that they are direct-current (DC) devices that are easily damaged by too high reverse voltage, whereas the power supplies for many devices that would benefit from the advantages of LEDs deliver alternating current (AC). Even low-voltage light fixtures typically use a 12V AC power source, which is transformed from, for example, 120V AC at 60 Hz.

One common way to provide direct current to LEDs from an AC source is to include in the power-supply circuit a full-wave rectifier and a current-limiting device such as a power resistor. One drawback of this approach is that four rectifying diodes are typically needed and each of these rectifying diodes must carry half the full current load of all the LEDs.

Another known way to provide DC current to LEDs is to include in the power-supply circuit a half-wave rectifier and, again, a current-limiting device such as a power resistor. This is a much simpler circuit than is needed for full-wave rectification, but even it has at least three major drawbacks: First, the light emitted from the LEDs will flicker, for example, at 120 Hz in case the AC power source frequency is 60 Hz. Second, when the supplied voltage is negative, this circuit assumes that the LEDs will evenly divide the reverse voltage among themselves. Failure to do so can lead to a cascade failure of the LEDs; this failure is most prominent in transient conditions. Third, the rectifying diode must carry the full current load of the LEDs.

Even assuming that the power supply problems of the LEDs are overcome, there must still be some convenient way to mount and install the lights themselves. There are of course many different types of light fixtures for the many different common types of incandescent light bulbs. These fixtures feature an array of different types of physical connections with wedge, screw-in, bayonet, flange, bi-pin and other bases. This means that any after-market LED-based light bulb replacement must be able to correctly connect to the different types of existing sockets of the bulbs it is intended to replace. It would be possible to mount LED units within the casings—usually bulbs—of the original lights, but this complicates the manufacture of such LED replacements.

Yet another concern is that incandescent elements can typically be mounted without regard to polarity, whereas existing LED arrangements cannot. When installing an LED replacement in a DC system such as an automobile tail light, there is therefore a risk of incorrect installation because even with a given fitting, the polarity of the wiring is not always the same from one car manufacturer to another.

What is needed is an LED lighting arrangement that eliminates or at least reduces the problems mentioned above. Furthermore, some fitting is needed to enable easy after-market LED replacement. This invention provides such an arrangement and fitting.

SUMMARY OF THE INVENTION

A lighting arrangement comprises a source of electrical power and at least one pair of light-emitting diodes (LEDs) driven by the power source. The power source may have different characteristics. Advantageously, the power source supplies unrectified alternating current to each LED pair, although various embodiments of the invention provide advantages even in applications whose power source supplies direct current.

The LEDs are connected in parallel such that an anode of a first one of the LEDs in the pair is electrically connected to the cathode of the other, second LED in the pair, and the anode of the second LED is electrically connected to the cathode of the first LED in the pair. One of each pair of LEDs is thus forward biased to produce light regardless of the instantaneous polarity of electrical current supplied to the LED pair by the power source.

A current-limiting device such as a resistor may be connected in series between the power source and each LED pair.

Any number of LED pairs may be included in the arrangement. For example, m LED pairs may be connected in series in each of n parallel paths.

In one embodiment of the invention, a printed circuit board (PCB) base that has front and rear surfaces is manufactured with laterally extending side-edge protrusions. Contact surfaces are then provided on edge surfaces of the protrusions, for example, by deposition. The PCB base may then be used to form a mounting substrate for the LED pairs.

One way to create the protrusions along the periphery of the base is to bore or route through-holes in the PCB with a pitch or indexing corresponding to at least one internal mating surface of a light fixture. By positioning the protrusions so that they mate with at least one internal contact surface of a light fixture, this embodiment of the invention may be used as an after-market replacement for existing light bulbs designed for screw-in, bayonet, flanged, etc., fittings. One alternative embodiment of the invention provides a base suitable for installation in a wedge-based fitting.

For fittings such as screw-in and bayonet fittings, etc., the base may also be provided with an arrangement for biasing the contact surfaces of the protrusions into electrical contact with the internal contact surfaces of the fittings. One way to do this is to provide in the PCB base at least one slot so as to form a region of lateral compression. In these cases, the PCB base should have a width equal to or slightly greater than an internal dimension of the light fixture. Upon installation of the PCB base in the fixture, compression of the PCB base will then create a lateral biasing force.

In yet another embodiment of the invention, a separate pair of parallel-connected LEDs are mounted on the front and back surfaces of the PCB base, with one LED in each pair being forward biased at the same time as a corresponding LED in the other pair. Front-and-back illumination is then provided by the LED pairs on the single PCB substrate.

In still another embodiment of the invention, a plurality of LED pairs are mounted on a single printed circuit board (PCB) base, including at least three pairs producing light of each of three colors, such as red, green and blue such that objects illuminated by the arrangement will appear to a viewer to be illuminated by white light.

In most implementations of the invention, the LEDs in each pair will be normal single-die LEDs. Another aspect of the invention provides, however, for a multi-die LED such that the LED pair comprises two LED dies mounted with reverse polarity within a single LED casing.

When the LEDs are driven from an AC power source, each LED element in a coupled pair will have a duty cycle of 50%. This arrangement allows for substantial thermal advantages. In applications of the invention in which a plurality—in some cases even dozens—of LED pairs are mounted on a single printed circuit board (PCB) base, they may be densely mounted, separated by no more than 1 mm.

DETAILED DESCRIPTION

Figure 1:
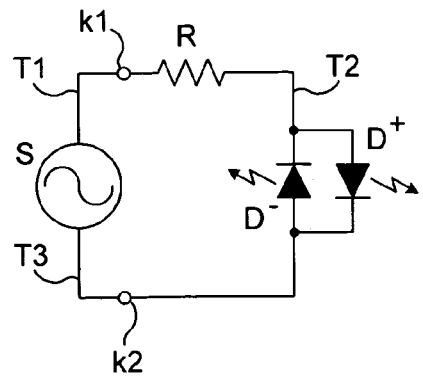
FIG. 1 is a circuit drawing of the simplest embodiment of an "AC LED" according to the invention.

FIG. 1 is a circuit diagram that illustrates the fundamental embodiment of the invention: A pair of LEDs $D^+$ and $D^-$ are connected in parallel, with reverse polarity (with the anode of $D^+$ connected to the cathode $D^-$ and the anode of $D^-$ connected to the cathode of $D^+$), in series with a current-limiting device, R, typically a resistor, and driven via contacts k1, k2 by a power (or, equivalently, voltage or current) source S that delivers either alternating or direct current.

In applications that require illumination (such as reading lights) as opposed to simple indication (such as on/off), the LEDs $D^+$ and $D^-$ are preferably of the super-luminescent type, for obvious reasons. Even a minimally skillful electrical engineer will be able to choose the actual type of LEDs used, as well as the type and value of the resistor R, to fit the needs of a given application given the specifications of the power source S, in particular, its peak delivered voltage.

Assume for the sake of illustration that when the source S supplies positive voltage, current is flowing in the clockwise direction (viewed as in FIG. 1); negative output voltage therefore gives a counter-clockwise current flow. The operation of the LED pair $D^+$ and $D^-$ then follows from the known properties of diodes: When the source S is producing positive voltage, LED $D^+$ will be forward biased and will light up, whereas LED $D^-$ will be reverse biased at the forward bias voltage of $D^+$ and will not give off light. The reverse voltage over $D^-$ will be kept within safe limits (typically less than 4.0V for a white color LED and less than 2.0V for a red LED), at the forward bias voltage of $D^+$, as $D^+$ will be conductive. Current through $D^+$ will be limited by the resistor R. When the source voltage polarity switches, so too does the conductive LED in the pair: $D^-$ will become conductive and $D^+$ will be reverse biased at the forward bias voltage of $D^-$. The two paired LEDs $D^+$ and $D^-$ thus operate as a single "AC LED" in that, as long as the supply voltage is above the minimum forward turn-on voltage, one LED of the pair will always be producing light.

Some of the advantages even of the basic embodiment of the invention shown in FIG. 1 are:

The only diodes required are those that actually produce light—no rectifying elements are needed at all.

The invention will work whether the voltage source S delivers alternating or direct current. When operating with a DC voltage source, only one of the LEDs will be active, but on the other hand, the assembly of only three components R, $D^+$ and $D^-$ will work equally well regardless of the polarity of the voltage source S.

Each LED $D^+$ and $D^-$ is protected from reverse voltage breakdown by the other LED in the pair.

When operating with an AC voltage source, flicker is greatly reduced. In fact, at typical supply frequencies, for example, 60 Hz, $D^+$ and $D^-$ will both appear as 120 Hz but totally out of phase with each other; therefore, little flicker will be apparent to a viewer at all.

When powered from an AC source, the peak current of each LED may reach a value higher than the allowed continuous DC current. In such case, the LEDs will emit a higher peak brightness intensity while maintaining lower temperature than when driven at the maximum allowable DC current, which reduces the risk of damage and premature failure.

Figure 2:
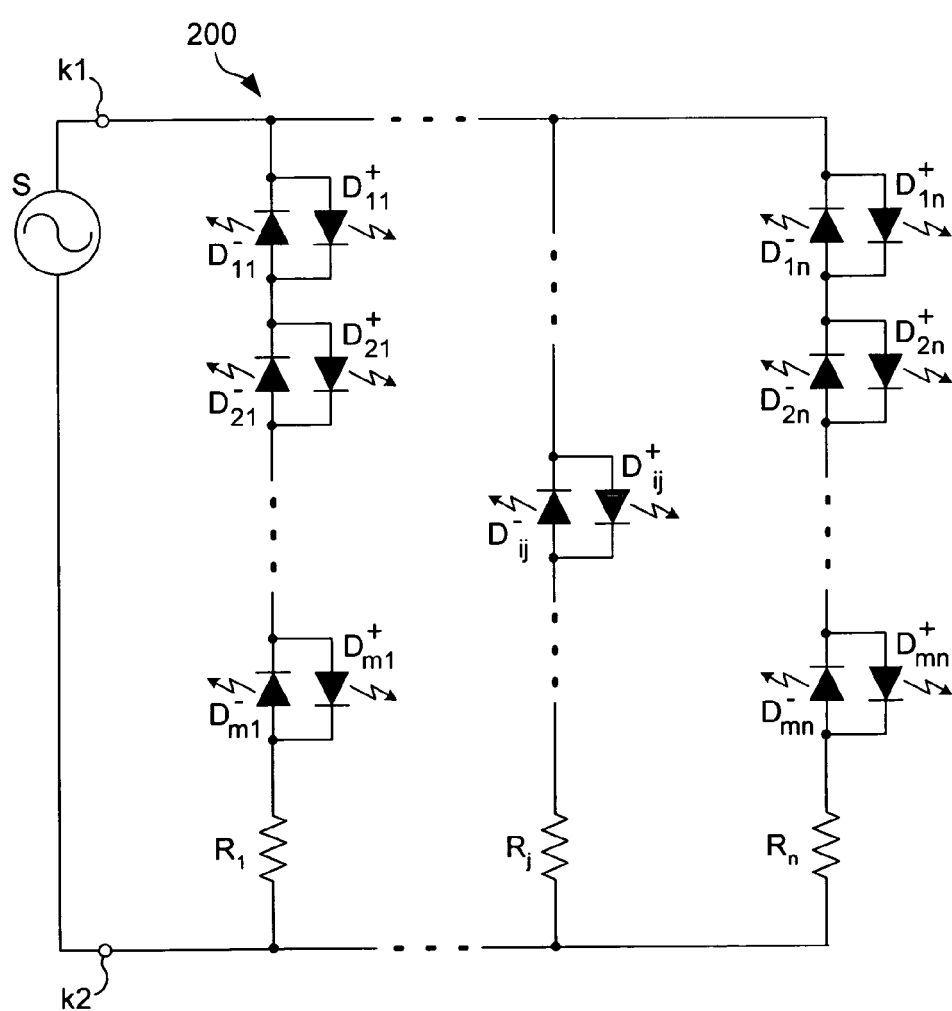
FIG. 2 is a circuit drawing of a generalized embodiment of the invention, including an LED array.

FIG. 2 illustrates a generalized embodiment of the invention: Rather than a single LED pair $D^+$ and $D^-$ being connected in parallel with reverse polarity, an m-by-n array 200 of such LED pairs $D_{ij}^+$ and $D_{ij}^-$ is provided (i=1, ..., m; j=1, ..., n), with m LED pairs connected in series in each of n parallel paths.

A separate current-limiting device, $R_j$, again, usually a resistor, is preferably included in each parallel path in series with the LED pairs. Although not strictly necessary to the invention (a single current-limiting device could be used as shown in FIG. 1), this reduces the load through any given resistor (for example) and allows for variation in the number or characteristics of the diodes in each parallel path. The value(s) of $R_j$ may be chosen using normal design methods, taking into account the number and characteristics of the LEDs and the properties of the voltage source S.

Each LED pair in the array may use the same diode type (and/or color) and be arranged the same as all other pairs, although this is not strictly necessary as long as standard measures (such as adjusting the appropriate resistor values) are taken to ensure proper voltage and current supply to the LEDs. In FIG. 2, the same number (m) of LED pairs is shown in each of the n parallel LED paths. This is not necessary to the invention; rather, unequal numbers of LED pairs may be included in different paths—again, using separate resistors $R_j$ in each path facilitates this option.

The operation of each pair of LEDs in the array will be the same as described above for the single pair $D^+$ and $D^-$ shown in FIG. 1: At any given time, at most one LED in each pair will be forward biased and therefore giving off light, the other being reverse biased and therefore turned off.

Figure 3:
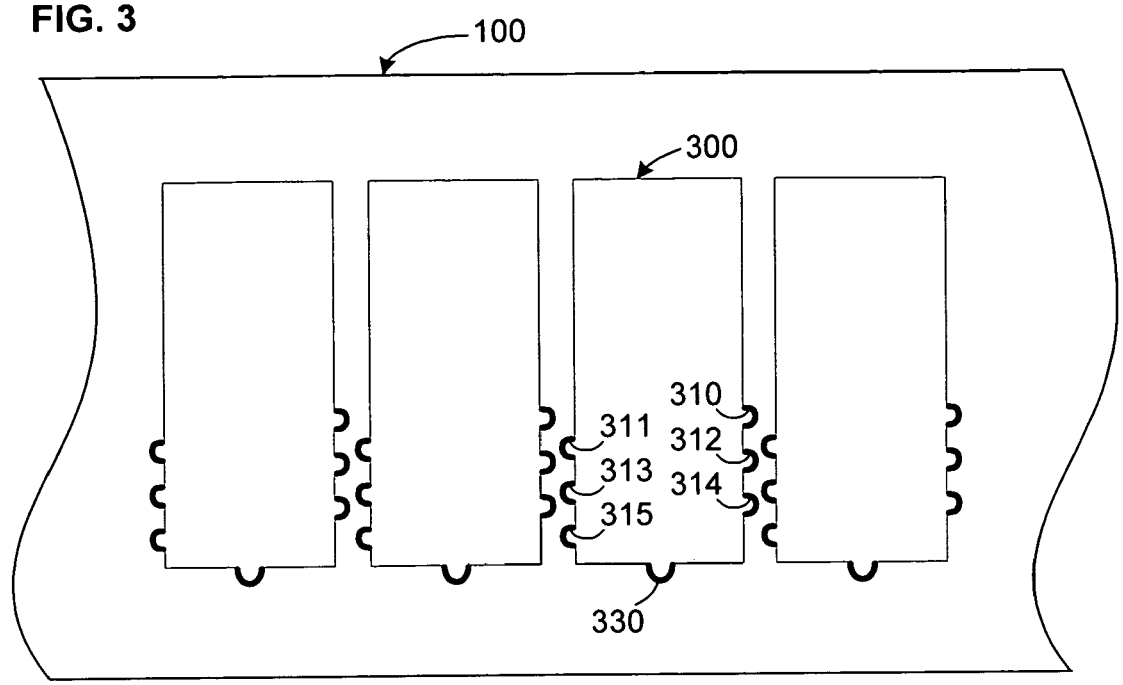
FIG. 3 is a plan view of a printed circuit board (PCB) from which several PCB bases are manufactured for an embodiment of the invention suitable for use as an after-market replacement for light with a typical screw-in fitting.

FIG. 3 illustrates a standard printed circuit board (PCB) 100, from which a plurality of bases are to be manufactured. For the sake of simplicity, only a single base 300 is described in detail. Any number (including a single one) of identical bases may be made from the PCB 100.

As FIG. 3 shows, a plurality of through-holes or routes (illustrated using a heavier lines) are cut or bored through the PCB, preferably by conventional 1 mm routing, so as to form a plurality of laterally extending protrusions 410–415, and preferably a bottom protrusion 430, which extends out from the outer edge of the base 300. In the preferred embodiment of the invention, the routes are curved, at least substantially semi-circular, although this is not essential and will depend on the cross-sectional geometry of the threaded or slotted contact surface of the fitting the base 300 is to be installed in (see below); thus, the protrusions could be right-angled or other have some other shape.

Figure 4:
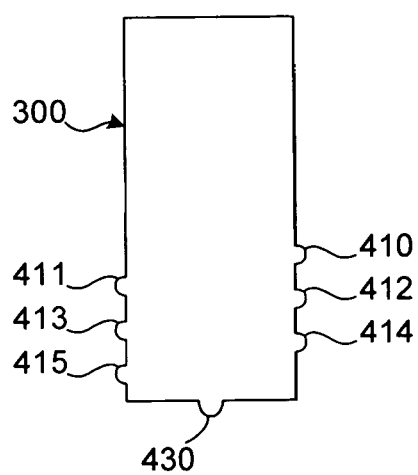
FIG. 4 is plan view of a single PCB base separated from the PCB shown in FIG. 3.

After routing, the routes 410–415, 430 are treated, preferably using a standard PCB plating process, to deposit an electrically conductive material such as copper on the inside, upper, and lower surfaces of the routes. The PCB base 300 is then either punched out of the larger PCB 100 by using a pre-designed punch-and-die set or scored and broken along the lines defining the rest (other than the protrusions) of the periphery of the base 300. FIG. 4 illustrates the base 300 after separation from the PCB 100. In the figures, six side-edge protrusions 410–415 are shown merely by way of example; the actual number used may vary and in any given implementation of the invention will depend on the needs of that implementation.

Figure 5:
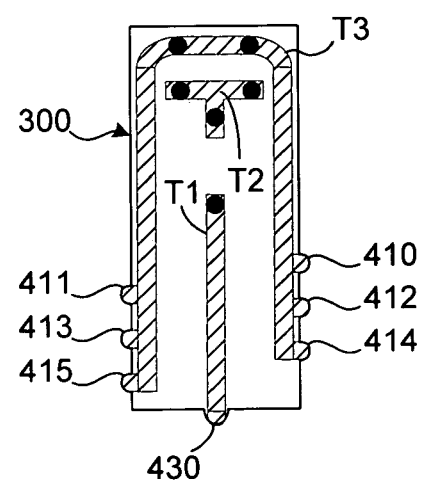
FIG. 5 illustrates an example of a trace pattern used in the embodiment of the invention that provides an AC LED for screw-in fittings.

FIG. 5 illustrates one example of a pattern of traces T1, T2, T3 used to create the electrical connections symbolized in FIG. 1, with the traces corresponding to the similarly numbered leads in FIG. 1. The dark dots represent solder pads used to electrically connect component leads to the traces. As part of plating the protrusions 410–415 some of the conductive plating material will be deposited on the inside, upper and lower surfaces of the base 300 as well so as to join with adjacent portions of the trace T3. The trace T3 will therefore be in electrical contact with the inner surfaces of the protrusions. Similarly, the conductive material deposited on the bottom edge protrusion 430 will be electrically connected to the trace T1.

Figure 6:
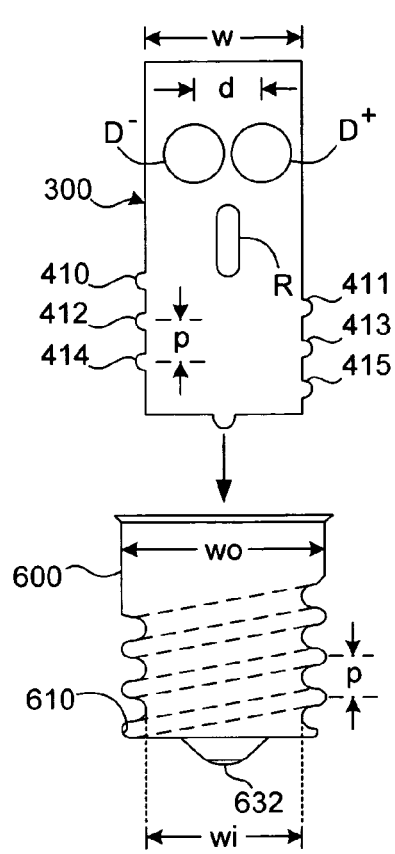
FIG. 6 shows an example of component layout on the PCB base illustrated in FIGS. 4 and 5, as well as how this PCB base can be screwed into a typical socket.
Figure 7:
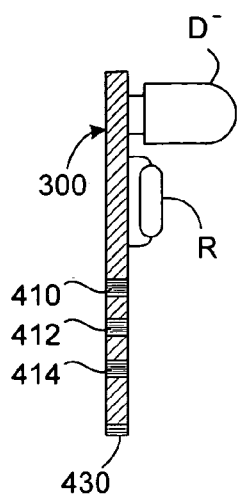
FIG. 7 is a side view of the arrangement shown in FIG. 6.

FIGS. 6 and 7 illustrate one example of how the LEDs $D^+$, $D^-$ and the current-limiting element (here, resistor) R can be mounted on the base 300. In FIG. 6, the distance between the centers of the LEDs is indicated as d. This distance d should be kept as small as possible so as to reduce any parallactic optical effects when the user views the light and thus to increase the impression that the LED pair is a single AC LED. For example, when using standard 5 mm LEDs, which have a diameter of approximately 5 mm, d should be from five to eight millimeters, and preferably from five to six millimeters; in other words, the LEDs should either just touch, or be no more than 3 mm apart, and preferably no more than 1 mm. FIG. 7 is a side view of the PCB 300 with the components $D^+$, $D^-$ and R mounted.

Even though LEDs will typically generate less than 0.1 W of power each, applications such as those that have limited space but require high light intensity also require very close packing of multiple LEDs. In existing arrangements, this leads to severe problems of heat dissipation. One advantage of connecting the LEDs in pairs (especially in the multi-LED embodiments of the invention shown below) to form an "AC LED" is that each LED is only "on" about half the time; this reduces generated heat and gives better opportunity for effective heat dissipation. Even disregarding the thermal advantages of the LEDs' 50% duty cycles, the invention still will operate much cooler than a typically halogen bulb, whose operating temperature is as high and potentially dangerous as 200° C.

FIG. 6 also illustrates a screw-in fitting 600 typically used to receive incandescent bulbs. Inner and outer dimensions (usually, diameters) of the fitting 600 are shown as wi and wo, respectively. The vertical separation (viewed as in FIGS. 4–6), that is, the pitch p, of the protrusions 410–415 is then chosen to match the pitch p of the internal contact threading 610 of the screw-in fitting 600 the light is to be installed in.

The width w of the main portion (without the protrusions 410–415) of the base 300 is preferably chosen to be the same or slightly less than the inner diameter of the screw-in fitting 600. When the base 300 is screwed into the fitting 600, the helical inner contact surface 610 of the fitting will electrically contact at least one (and usually all) of the plated protrusions 410–413; the trace T1 will be electrically connected with the other contact 632 of the fitting via the protrusion contact 430. In a different but preferred embodiment of the base 300, the width w is preferably slightly greater than wi; this is described below in conjunction with FIG. 8.

Figure 8:
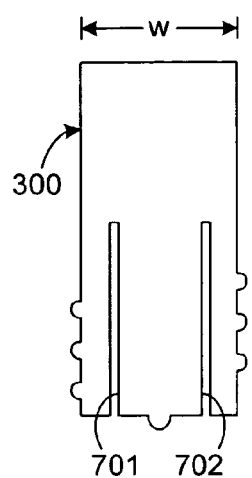
FIG. 8 illustrates a preferred way to spring-bias the PCB base of FIGS. 4–7 so as to improve electrical contact between the base and the screw-in socket.

FIG. 8 shows the preferred method according to the invention for providing a lateral biasing force to increase the contact between the plated protrusions 410–413 and the inner contact surface(s) 610 of a fitting: Using conventional techniques, slots 701, 702 are cut or punched into the base 300 so as to preferably extend in the direction in which the base is installed in the fitting. In the illustrated example, the slots are therefore vertical. The illustrated slots are straight, but this is not required by the invention and will in many cases depend on the layout of traces. Curved slots are also possible, or slots with a more complicated geometry.

The width w of the main portion of the base 300 (not including the protrusions) may then be slightly greater than the inner diameter wi of the fitting 600. When the base 300 is installed, for example, screwed in, it will therefore compress laterally, squeezing together the slots 701, 702. The flexibility of the PCB material itself will bias the protrusions 410–415 outward against the inner contact surfaces 610 of the fitting 600.

Another way to bias the base against the inner contact surface(s) 610 of the fitting 600 would be to mount an electrically conductive compression spring (not shown) on the bottom protrusion 430 and to connect this spring to the trace T1. The biasing force would then be vertical, which would tend to force the upper plated edges of the edges of the protrusions 410–415 into physical and thus electrical contact with the inner contact surface (s) 610 of the fitting 600.

The invention is easily adapted for use in other types of fittings besides the screw-in fitting shown in FIG. 6. For example, using only two plated protrusions, one on either side, the base 300 could be used to fit into a standard bayonet fitting. By adjusting the vertical separation (from zero upward) of the protrusions, and the base width, most standard bayonet fittings could be accommodated, regardless of their degree of indexing. A flanged base can also be created using a similar technique.

Figure 9:
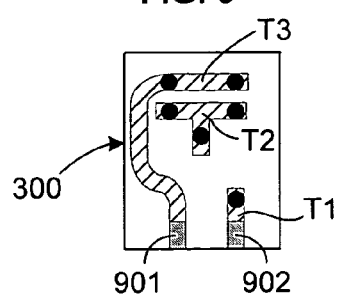
FIG. 9 illustrates an embodiment of the invention suitable for after-market installation in a wedge-type fitting.

The "AC LED" according to the invention may of course also be used in fittings that do not require screwing in or rotation at all. FIG. 9 illustrates, for example, how the base 300 may be formed so as to fit into a standard wedge-type fitting. In this case, no special protrusions are required at all. Rather, standard contacts 901, 902 are bonded onto the PCB so as to contact the traces leading current from the two different poles of the voltage source. The lateral separation of the contacts 901, 902 will of course be chosen to match the positions of the female contacts (usually, spring-biased contacts in slots) into which the base 300 is to be fitted. Note that this embodiment of the base 300 may be made exceptionally compact, in most cases little larger (and possibly even smaller) than the incandescent bulb it replaces.

Figure 10:
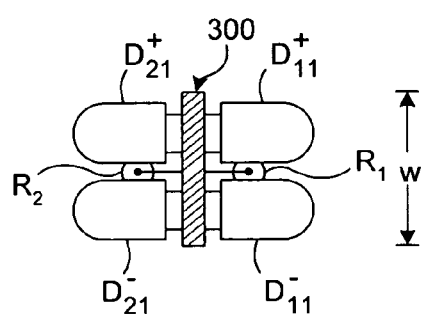
FIG. 10 illustrates an embodiment of the invention in which two AC LEDs according to the invention are provided on a single PCB substrate.

FIG. 10 illustrates just one of many different ways in which more than one LED pair, in this case $D_{11}^+$, $D_{11}^-$, and $D_{21}^+$, $D_{21}^-$ may be mounted on a single base 300. Depending on the needs of the particular implementation, the two pairs may be connected either in series (comparing with FIG. 2, m=2 and n=1) or in parallel (m=1 and n=2). If the LED pairs are connected in parallel, then separate resistors $R_1$ and $R_2$ are preferably included, one in each path. Traces to supply current to the LEDs may then be routed in any known manner, also depending on the type of fitting the light is to be used in.

The usefulness of the configuration shown in FIG. 9 is more than simply the doubling the number of LEDs active at any one time. One additional advantage is that it allows for front-and-back illumination coverage. Most common LEDs have up to approximately 50-degree illumination coverage; front-and-back mounting would therefore provide roughly 100-degree coverage. The degree of coverage in any given implementation of the illustrated embodiment of the invention will of course depend on the degree of coverage of the chosen LEDs.

It would also be possible to bend the leads of the LEDs, or to mount them differently, so that they extend laterally out from the base 300 rather than perpendicularly away from its surface.

Still another advantage arises in industries such as the automotive industry. Tail lights in a car are DC devices, but the fittings are usually polarized nonetheless, such that the invention, in particular, the base 300, would be able to fit in the fitting in only one orientation. Because the invention provides an "AC LED," polarity will not make any difference. On the other hand, the "correct" orientation of the invention for a given car model, or in a given fitting (left as opposed to right, for example) might be such that a single LED pair, as shown in FIGS. 6 and 7, would be facing backwards. The twin-pair LED arrangement of FIG. 10 would eliminate this concern.

Note that LEDs are typically so cheap that it would in most cases be better simply to have "idle" LEDs rather than having separate "left-handed" or "right-handed" bases. Rather than allow an LED pair to illuminate to no purpose (for example, the pair facing away from any potential viewers), it would also be possible to route current to the two LED pairs through a switch (double-pole double-throw) so that only one pair is activated at any time; if the PCB is mounted "backwards" then the user can flip the switch and activate the other LED pair.

Figure 11:
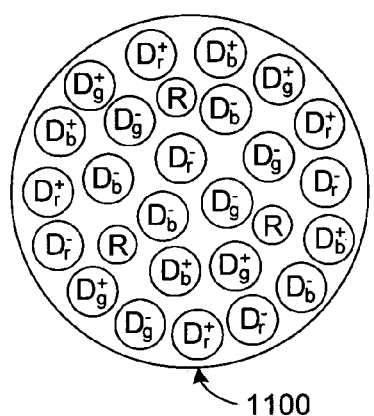
FIG. 11 illustrates one example of how several LEDs of different colors may be mounted on a PCB base and electrically connected as in FIG. 2 so as to approximate a full-spectrum light source.
Figure 12:
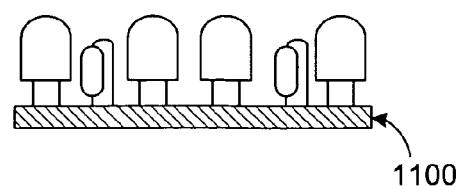
FIG. 12 is a side view of the arrangement shown in FIG. 11.

FIGS. 11 and 12 illustrate, respectively, top and side views of an embodiment of a multi-element, multi-path AC LED configuration that provides substantially full-spectrum light, at least at distances from the light assembly that users will normally be located for reading, working, etc. In this embodiment, several LEDs are mounted in any known manner so as to extend at least substantially perpendicular from a PCB base 1100. Again, the LEDs are preferably mounted close together; as before, the LEDs should either just touch, or be no more than 3 mm apart, and preferably no more than 1 mm apart. LEDs are included that emit three different wavelengths, that is, colors, preferably red, blue and green, (or any other combination of colors) which, when mixed, are perceived by a viewer as being full spectrum white. The LEDs are preferably distributed so that no color clearly predominates in any particular region of the layout.

In this multi-color embodiment of the invention, the LEDs are preferably connected as reversed-polarity pairs as shown in FIG. 2, with a resistive element (labeled "R") for each electrically parallel branch. Thus, the LEDs will be of six "types" $D^+_r$, $D^-_r$, $D^+_g$, $D^-_g$, $D^+_b$, and $D^-_b$, that is, permutations of color (indicated by subscripts r, g, and b for red, blue and green) and polarity.

All LED pairs emitting the same color may comprise one parallel branch of the configuration shown in FIG. 2, but this is not necessary. Rather, LED pairs of different colors may instead be connected in the same parallel path; this would enable the full-spectrum light effect even in the very unlikely event that one or more parallel paths were to fail. It would also be possible to include different numbers of LED pairs for different colors so as to properly balance the luminance for each color to create the most white effect; in this case, it is advantageous to series-connect the LEDs of each color so that proper resistance values can be chosen in each parallel path.

At a typical user's normal reading or working distance from the assembly, the light from the LEDs will be so "mixed" that the user will not be able to distinguish any red, green, or blue hues unless he is looking directly at the assembly. When looking at an illuminated object located at distances beyond about 20 cm from the assembly, and possibly even closer, the user will perceive the mixture of red, green, and blue as pure white, or, rather, full-spectrum light illuminating the object. Contrast this with a conventional "white" LED, which is simply a blue-light LED coated with phosphorous so as to introduce a yellow component to the spectrum and produce a "pseudo-white" color.

In one prototype of the multi-element embodiment of the invention illustrated in FIGS. 11 and 12, the base 1100 was substantially round, with a diameter chosen so the base would fit and could be used as an aftermarket insert into common halogen fixtures. The illustrated embodiment is particularly advantageous for mounting within existing MR11 or MR16 fixtures with a bi-pin base and mirror reflector (hence the "MR"), or the smaller G4 fixture. The structures used to connect the LEDs electrically to the power supply will be chosen depending on which type of conventional lighting assembly is to be replaced.

It is of course not necessary for the LEDs in the multi-element embodiment shown in FIGS. 11 and 12 to have different colors. Rather, all the elements could be of one color, such as white (for example, conventional "pseudo-white" LEDs), red (for example, for cockpits or boats or other environments where good night vision is important), or any other wavelength, including non-visible wavelengths. A simple switching mechanism could also be included to allow the user to switch between colors, for example, between white and red. Because the AC-coupling of LED pairs according to the invention enables them to operate much cooler than standard DC LEDs and in general much cooler than standard incandescent and halogen bulbs, even dozens of LEDs (single or multi-color) can be densely mounted on a single base 1100 and provide light as bright or brighter than the bulbs being replaced, yet at lower temperature.

Figure 13:
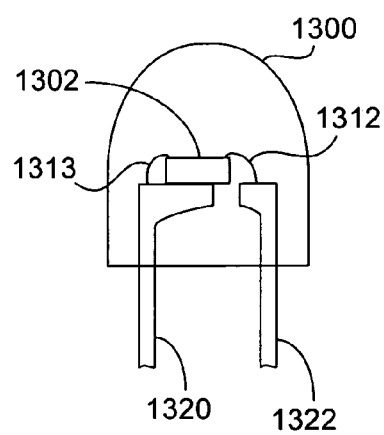
FIGS. 13 and 14 are side and top views, respectively, of a dual-element AC LED according to the invention in a single capsule.
Figure 14:
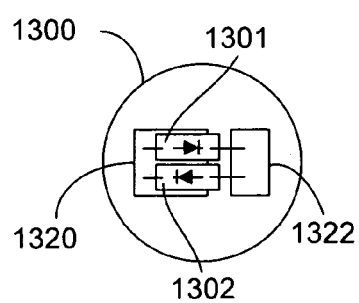

FIGS. 13 and 14 are side and top illustrations of an embodiment of the invention in which reverse-polarity LED elements (dies) 1301, 1302 are encapsulated in a single casing 1300. In FIG. 14, the standard diode symbols are included on the dies 1301, 1302 merely to show that these semi-conductive elements are connected with reverse polarity. Electrically conductive legs/leads 1320, 1322 extend into the casing, on one of which (leg 1320) the LED dies are mounted by conventional bonding methods. Two connecting wires are included for each element to connect it electrically to legs 1320 and 1322 and to complete the electric circuit from the power supply (not shown here) through the LEDs. Connecting wires 1312, 1313 are labeled in FIG. 13 for the element 1302; four connecting wires are shown in FIG. 14, two for each element 1301, 1302.

By including the two parallel connected, reverse-polarity LED dies within a single casing, a single component is provided that implements the AC LED according to the invention. Such a component could be used to implement any LED pair described in any embodiment of this invention.

Figure 15:
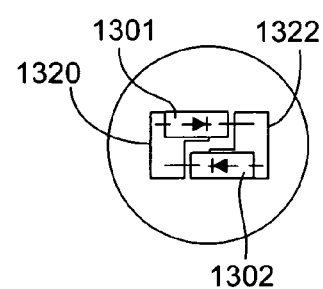
FIG. 15 illustrates an alternative layout of connectors and LED elements for the dual-element AC LED.

FIG. 15 shows an alternate configuration of the common-casing, AC LED, in which each element in the pair is mounted on a different one of the legs, with a respective connecting wire connecting the element to the opposite leg. One advantage of this structure is that the leg/die/wire configuration for each "side" is identical to the other, differing only in its mounted orientation within the casing. This simplifies manufacture, since only one arrangement is needed.

The invention claimed is:

1. A lighting arrangement comprising:
a source of electrical power;
m pairs of light-emitting diodes (LEDs), each pair of LEDs including a first LED and a second LED, driven by the power source and connected in parallel in each of n parallel paths such that an anode of the first LED in each pair is electrically connected to a cathode of the second LED in the pair, and an anode of the second LED in each pair is electrically connected to a cathode of the first LED in the pair, one of each pair of LEDs thereby being forward biased to produce light regardless of the instantaneous polarity of electrical current supplied to the LED pair by the power source;
a current-limiting device, connected in series between the power source and each LED pair;
in which:
the m pairs of LEDs in each respective parallel path are connected in series;
the n parallel paths share common power connections but are otherwise electrically separated from each other such that electrical current entering each parallel path passes through the m series-connected LED pairs of only that parallel path; and
m is a predetermined positive integer; and
n is a predetermined positive integer greater than one.

2. An arrangement as in claim 1, further comprising, for each of the n parallel paths, a current-limiting device, connected in series between the power source and the m LED pairs in each respective path.

3. A lighting arrangement comprising:
a source of electrical power; and
at least one pair of light-emitting diodes (LEDs) driven by the power source, each pair of LEDs including a first LED and a second LED, and connected in parallel such that an anode of the first one LEDs in each pair is electrically connected to a cathode of the second LED in the pair, and an anode of the second LED in each pair is electrically connected to a cathode of the first LED in the pair, one of each pair of LEDs thereby being forward biased to produce light regardless of the instantaneous polarity of electrical current supplied to the LED pair by the power source;
a printed circuit board (PCB) base having front and rear surfaces and laterally extending side-edge protrusions; and
contact surfaces on edge surfaces of the protrusions;
the PCB base forming a mounting substrate for the LED pairs.

4. An arrangement as in claim 3, in which the protrusions are positioned so as to mate with at least one internal contact surface of a light fixture.

5. An arrangement as in claim 4, in which the light fixture is a screw-in fitting.

6. An arrangement as in claim 4, in which the light fixture is a bayonet fitting.

7. An arrangement as in claim 4, in which the light fixture is a flanged fitting.

8. An arrangement as in claim 4, in which the light fixture is a wedge-based fitting.

9. An arrangement as in claim 4, in which the light fixture is a standard, pre-existing, commercially available fitting designed to receive an incandescent light bulb.

10. An arrangement as in claim 4, further comprising a biasing arrangement that biases the contact surfaces of the protrusions into electrical contact with the internal contact surfaces.

11. An arrangement as in claim 4, further comprising at least one slot in the PCB base forming a region of lateral compression, the PCB base having a width equal to or slightly greater than an internal dimension of the light fixture, compression of the PCB base, upon installation of the PCB base in the fixture, creating a lateral biasing force biasing the contact surfaces of the protrusions into electrical contact with the internal contact surfaces of the fixture.

12. An arrangement as in claim 3, further comprising a separate pair of parallel-connected LEDs on the front and back surfaces of the PCB base, one LED in each pair being forward biased at the same time as a corresponding LED in the other pair, whereby front-and-back illumination is provided by the LED pairs on the single PCB substrate.

13. An arrangement as in claim 1, in which the power source supplies unrectified alternating current to each LED pair, whereby only one of the LEDs in each LED pair will be forward biased at any given moment, and heat generated by the plurality of LED pairs is reduced and heat dissipation is increased.

14. A lighting arrangement comprising:

a source of electrical power; and at least one pair of light-emitting diodes (LEDs) driven by the power source, each pair of LEDs including a first LED and a second LED, and connected in parallel such that an anode of the first one LEDs in each pair is electrically connected to a cathode of the second LED in the pair, and an anode of the second LED in each pair is electrically connected to a cathode of the first LED in the pair, one of each pair of LEDs thereby being forward biased to produce light regardless of the instantaneous polarity of electrical current supplied to the LED pair by the power source;

in which;

a plurality of LED pairs are mounted on a single printed circuit board (PCB) base; and the plurality of LED pairs include at least three pairs producing light of each of three colors, whereby objects illuminated by the arrangement appear to a viewer to be illuminated by full spectrum white light.

15. An arrangement as in claim 14, in which the colors are red, green and blue.

16. An arrangement as in claim 1, in which the LED pair comprises two LED dies mounted with reverse polarity within a single LED casing.

17. An arrangement as in claim 13, in which a plurality of LED pairs are mounted on a single printed circuit board (PCB) base and the LEDs are separated by no more than 1 mm.

18. A lighting arrangement comprising:

a source of electrical power;

at least one pair of light-emitting diodes (LEDs), each pair of LEDs including a first LED and a second LED;

a current-limiting device, connected in series between the power source and each LED pair;

a printed circuit board (PCB) base having front and rear surfaces and laterally extending side-edge protrusions, the PCB base a mounting substrate for the LED pairs; and contact surfaces formed on edge surfaces of the protrusions;

in which:

the power source supplies unrectified alternating current to each LED pair;

each LED pair is driven by the power source;

the LEDs in each pair are connected in parallel such that an anode of the first LED in each pair is electrically connected to a cathode of the second LED in the pair, and an anode of the second LED in each pair is electrically connected to a cathode of the first LED in the pair, one of each pair of LEDs thereby being forward biased to produce light regardless of the instantaneous polarity of electrical current supplied to the LED pair by the power source; and the protrusions are positioned so as to mate with at least one internal contact surface of a fitting designed to receive an incandescent, plasma-based fluorescent or halogen bulb.

* * * * *